(12) United States Patent
Liao et al.

(10) Patent No.: US 12,106,981 B2
(45) Date of Patent: Oct. 1, 2024

(54) METHOD OF CHIP TRANSFERRING AND DEVICE/MODULE HAVING GAS GUIDING STRUCTURES WITH SUCTION OPENINGS AND INTAKE OPENING TO APPLY PREDETERMINED PRESSURE UNIFORMLY ON BACK SIDE OF TRANSFERRING SUBSTRATE

(71) Applicant: Micraft System Plus Co., Ltd., Taoyuan (TW)

(72) Inventors: Chien-Shou Liao, Taichung (TW); Shao-Wei Huang, Taichung (TW); Ching-Ju Lin, Taichung (TW)

(73) Assignee: Micraft System Plus Co., Ltd., Taoyuan (TW)

( * ) Notice: Subject to any disclaimer, the term of this patent is extended or adjusted under 35 U.S.C. 154(b) by 402 days.

(21) Appl. No.: 17/537,517

(22) Filed: Nov. 30, 2021

(65) Prior Publication Data

US 2022/0238358 A1    Jul. 28, 2022

(30) Foreign Application Priority Data

Jan. 28, 2021  (TW) .................................. 110103158

(51) Int. Cl.
| | | |
|---|---|---|
| *H01L 21/67* | (2006.01) | |
| *H01L 21/683* | (2006.01) | |
| *H01L 23/00* | (2006.01) | |

(52) U.S. Cl.
CPC .... *H01L 21/67144* (2013.01); *H01L 21/6838* (2013.01); *H01L 24/75* (2013.01); *H01L 24/95* (2013.01); *H01L 2224/75263* (2013.01); *H01L 2224/7565* (2013.01); *H01L 2224/7598* (2013.01); *H01L 2224/951* (2013.01)

(58) Field of Classification Search
CPC .. H10K 85/6572; H10K 85/657; H10K 50/11; H10K 71/00; H10K 71/164; H10K 2101/10; H10K 2102/351; H10K 2101/20; H10K 85/322; H10K 50/81; H10K 50/82; H10K 85/6574; H10K 85/6576; H10K 50/12; C07F 5/027; C09K 11/06; C09K 2211/1018; C09K 2211/1029; C09K 2211/1055; C09K 2211/1088; C09K 2211/1092
See application file for complete search history.

(56) References Cited

U.S. PATENT DOCUMENTS 11,018,041 B2 * 5/2021 Liao .................. H01L 21/67132

FOREIGN PATENT DOCUMENTS

| WO | WO-2018061896 A1 * | 4/2018 | ............. B23K 26/38 |
| WO | WO-2019188105 A1 * | 10/2019 | |

* cited by examiner

*Primary Examiner* — Ermias T Woldegeorgis

(57) ABSTRACT

A chip-transferring module, and a device and a method for transferring and bonding chips are provided. The chip-transferring module includes a mounting main body, a light-transmitting member, a first gas guiding structure and a second gas guiding structure. The mounting main body has a first accommodating space and a second accommodating space. The light-transmitting member is disposed in the first accommodating space. The first gas guiding structure is disposed in the mounting main body and has a plurality of suction openings exposed out of the mounting main body. The second gas guiding structure is disposed in the mounting main body and has at least one intake opening communicating with the second accommodating space.

10 Claims, 11 Drawing Sheets

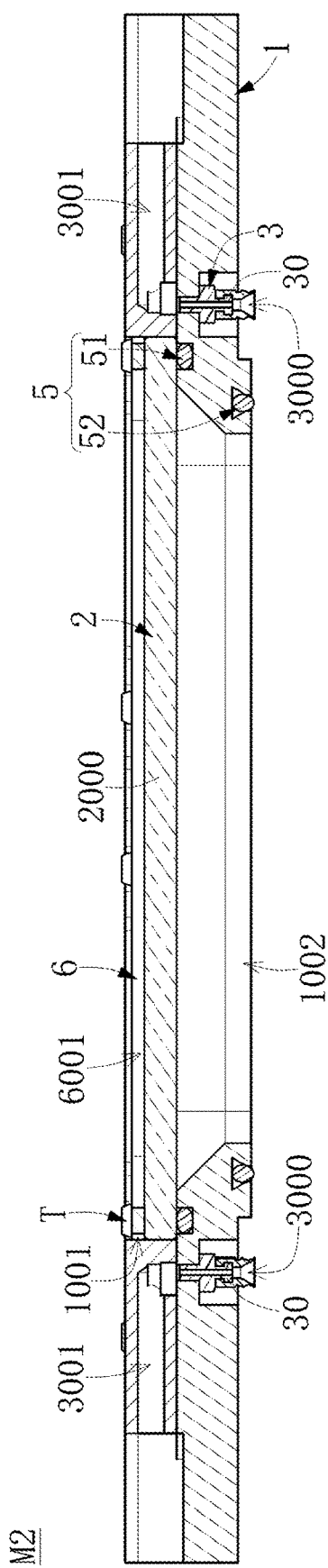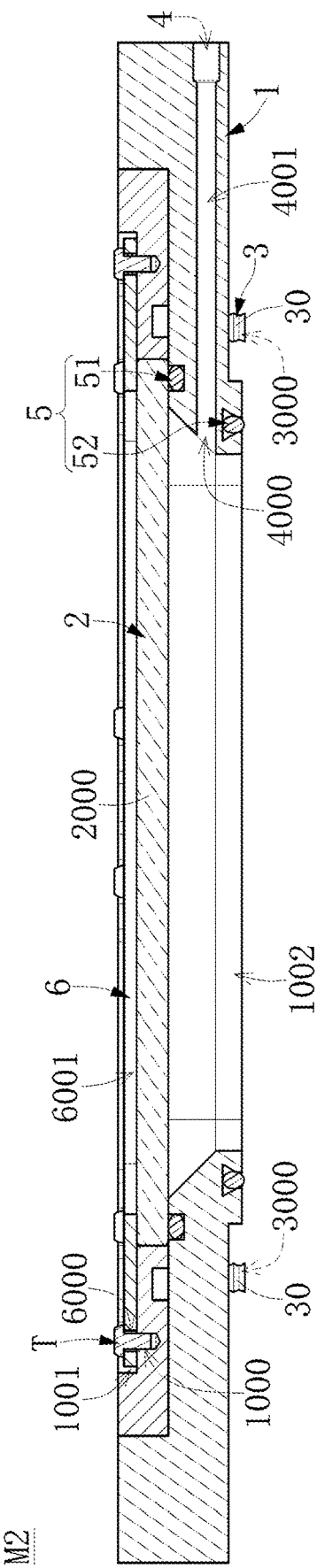

METHOD OF CHIP TRANSFERRING AND DEVICE/MODULE HAVING GAS GUIDING STRUCTURES WITH SUCTION OPENINGS AND INTAKE OPENING TO APPLY PREDETERMINED PRESSURE UNIFORMLY ON BACK SIDE OF TRANSFERRING SUBSTRATE

CROSS-REFERENCE TO RELATED APPLICATION

This non-provisional application claims priority under 35 U.S.C. § 119(a) on Patent Application No(s). 110103158 filed in Taiwan, R.O.C. on Jan. 28, 2021, the entire contents of which are hereby incorporated by reference.

BACKGROUND OF THE INVENTION

1. Field of the Invention

The present disclosure relates to a chip transferring module, and a device and a method for transferring and bonding chips, and in particular to a chip transferring module, a chip transferring and die bonding device using a chip transferring module, and a chip transferring and die bonding method using a chip transferring module.

2. Description of the Related Art

In the prior art, a light emitting diode chip may be transferred from a carrier to another carrier by means of picking and placing by a nozzle or pushing by a thimble, and the light emitting diode chip is mounted on a circuit substrate by means of external heating (for example, by a reflow furnace).

BRIEF SUMMARY OF THE INVENTION

A technical problem to be solved by the present invention is to provide a chip transferring module and a device and method for transferring and bonding chips for improving drawbacks of the prior art.

To solve the technical problem above, a chip transferring module is provided by a technical solution of the present invention. The chip transferring module includes a mounting main body, a light-transmitting member, a first gas guiding structure and a second gas guiding structure. The mounting main body has a first accommodating space and a second accommodating space. The light-transmitting member is disposed in the first accommodating space. The first gas guiding structure is disposed in the mounting main body and has a plurality of suction openings exposed out of the mounting main body. The second gas guiding structure is disposed in the mounting main body and has at least one intake opening communicating with the second accommodating space of the mounting main body.

To solve the technical problem above, a device for chip transferring and die bonding is provided. The device includes a substrate mounting module, a chip transferring module and a laser generating module. The substrate mounting module is for mounting a circuit substrate. The chip transferring module is for transferring a plurality of chips onto the circuit substrate. The laser generating module is for fixing the chips on the circuit substrate. The chip transferring module includes a mounting main body, a light-transmitting member, a first gas guiding structure and a second gas guiding structure. The mounting main body has a first accommodating space and a second accommodating space. The light-transmitting member is disposed in the first accommodating space. The first gas guiding structure is disposed in the mounting main body and has a plurality of suction openings exposed out of the mounting main body. The second gas guiding structure is disposed in the mounting main body and has at least one intake opening communicating with the second accommodating space of the mounting main body.

To solve the technical problem above, a method for chip transferring and die bonding is provided according to another technical solution of the present invention. The method includes: providing a transferring substrate having a front side on which a plurality of chips are mounted; moving the transferring substrate to dispose the plurality of chips on a circuit substrate; providing gas with a predetermined pressure to a back side of the transferring substrate to pressure the chips to contact with the circuit substrate tightly through the transferring substrate by the gas; fixing the chips on the circuit substrate; and removing the transferring substrate.

One benefit achieved by the present invention is that, the chip transferring and die bonding device and the chip transferring module thereof of the present invention, by the technical solutions "the mounting main body includes a first accommodating space and a second accommodating space", "the light-transmitting member is disposed in the first accommodating space of the mounting main body", "the first gas guiding structure is disposed in the mounting main body, and has a plurality of suction openings exposed out of the mounting main body" and "the second gas guiding structure is disposed in the mounting main body, and has at least one intake opening communicating with the second accommodating space of the mounting main body", when a transferring substrate mounted with a plurality of chips is adsorbed at the bottom side of the mounting main body through suction of the plurality of suction openings of the first gas guiding structure and seals the second accommodating space, gas with a predetermined pressure is introduced via at least one intake opening of the second gas guiding structure and enters the second accommodating space of the mounting main body, such that the gas with the predetermined pressure uniformly pressures a back side of the transferring substrate.

Another benefit achieved by the present invention is that, in the method for chip transferring and die bonding of the present invention, by the technical solutions "providing a transferring substrate having a front side on which a plurality of chips are mounted", "moving the transferring substrate to dispose the plurality of chips on a circuit substrate", "providing gas with a predetermined pressure to a back side of the transferring substrate to pressure the plurality of chips to contact with the circuit substrate tightly through the transferring substrate by the gas", "fixing the plurality of chips on the circuit substrate", and "removing the transferring substrate", when a transferring substrate mounted with a plurality of chips is adsorbed at the bottom side of the mounting main body through suction of the plurality of suction openings of the first gas guiding structure and seals the second accommodating space, gas with a predetermined pressure is introduced via at least one intake opening of the second gas guiding structure and enters the second accommodating space of the mounting main body, such that the gas with the predetermined pressure uniformly pressures a back side of the transferring substrate.

To further understand the features and technical contents of the present invention, the present invention is described in detail with the accompanying drawings below. It should be noted that the drawings provided are for reference and illustration purposes, and are not to be construed as limitations to the present invention.

BRIEF DESCRIPTION OF THE DRAWINGS

FIG. 5 is a section schematic diagram along section line V-V in FIG. 4.

FIG. 6 is a section schematic diagram along section line VI-VI in FIG. 4.

DETAILED DESCRIPTION OF THE INVENTION

Figure 1:
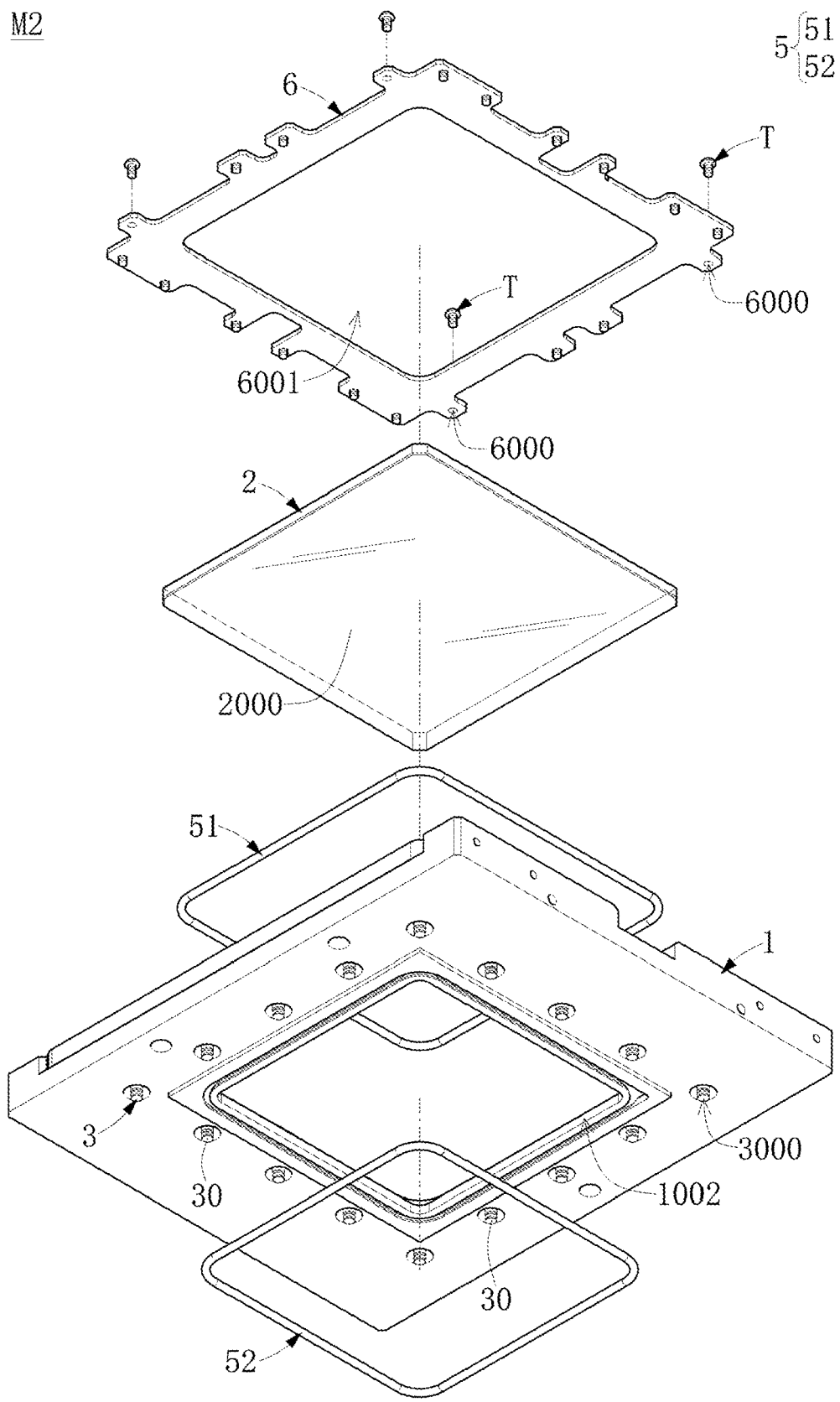
FIG. 1 is a three-dimensional exploded schematic diagram from one perspective of a chip transferring module provided according to a first embodiment of the present invention.
Figure 2:
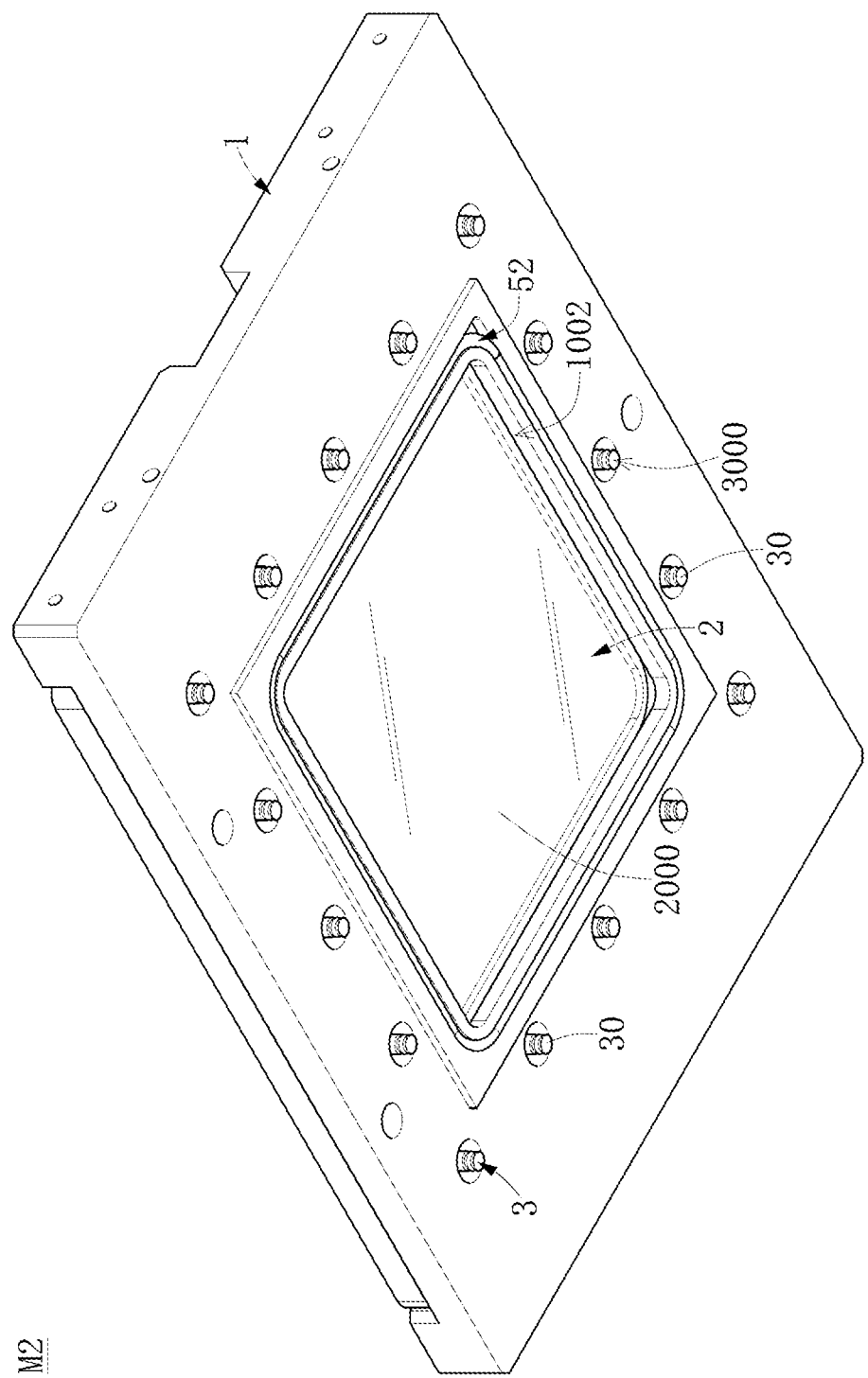
FIG. 2 is a three-dimensional schematic diagram of assembly from one perspective of a chip transferring module provided according to the first embodiment of the present invention.
Figure 3:
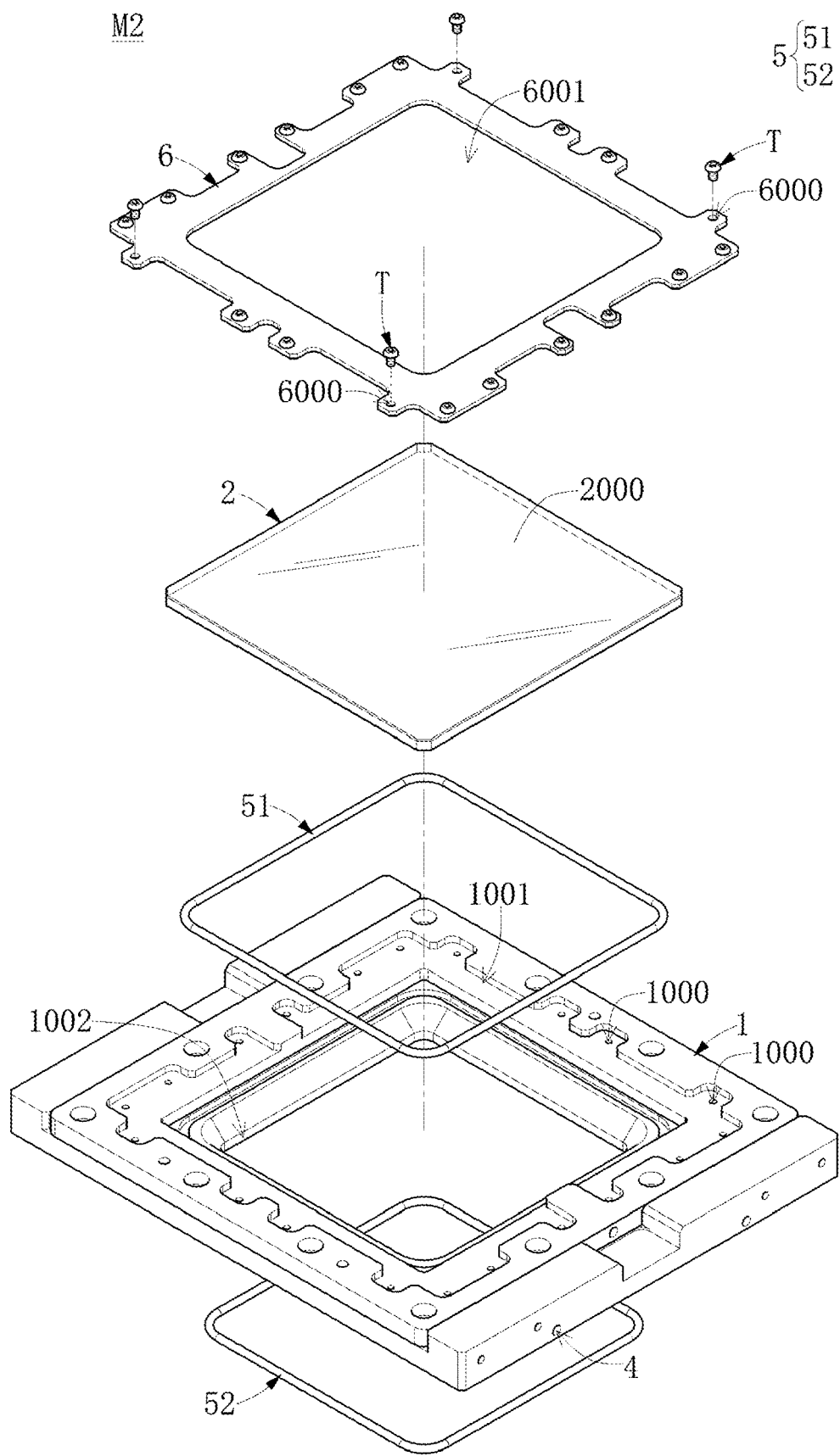
FIG. 3 is a three-dimensional exploded schematic diagram from another perspective of a chip transferring module provided according to the first embodiment of the present invention.

The implementation related to "chip transferring module and device and method for chip transferring and die bonding" of the present invention are described by way of specific embodiments, and a person skilled in the art would be able to understand the advantages and effects of the present invention on the basis of the disclosure of the present application. The invention may be implemented or applied by other specific embodiments, and changes and modifications may also be made on the basis of different perspectives and applications to various details in the description without departing from the concept and spirit of the present invention. Moreover, it should be noted that the drawings of the present invention are depicted in brief for illustration purposes, and are not drawn to actual scales. Technical contents associated with the present invention are described in detail below, and it should be noted that the disclosure is not to be construed as limitations to the scope of protection of the present invention. In addition, the term "or" used in the literature may include one or more combinations of related enumerated items depending on actual conditions.

First Embodiment

Referring to FIG. 1 to FIG. 8, a chip transferring module M2 provided according to a first embodiment of the present invention includes a mounting main body 1, a light-transmitting member 2, a first gas guiding structure 3 and a second gas guiding structure 4.

Referring to FIG. 1, FIG. 3, FIG. 5 and FIG. 6, the mounting main body 1 includes a first accommodating space 1001 and a second accommodating space 1002. For example, the first accommodating space 1001 and the second accommodating space 1002 are respectively formed on a top side and a bottom side of the mounting main body 1, and the first accommodating space 1001 and the second accommodating space 1002 are separated by the light-transmitting member 2 from communicating with each other. However, the present invention is not limited to the examples above.

Again referring to FIG. 2, FIG. 3, FIG. 5 and FIG. 6, the light-transmitting member 2 is disposed in the first accommodating space 1001 of the mounting main body 1, and has an exposed portion 2000 corresponding to the second accommodating space 1002 of the mounting main body 1 (that is to say, the exposed portion 2000 of the light-transmitting member 2 is exposed by the second accommodating space 1002 of the mounting main body 1, and is not shielded by the physical part of the mounting main body 1). For example, the light-transmitting member 2 may be made of any light-transmitting material (for example, quartz), and may be made of an inorganic light-transmitting material, a high polymer light-transmitting material, or a light-transmitting composite material. However, the present invention is not limited to the examples above.

Figure 7:
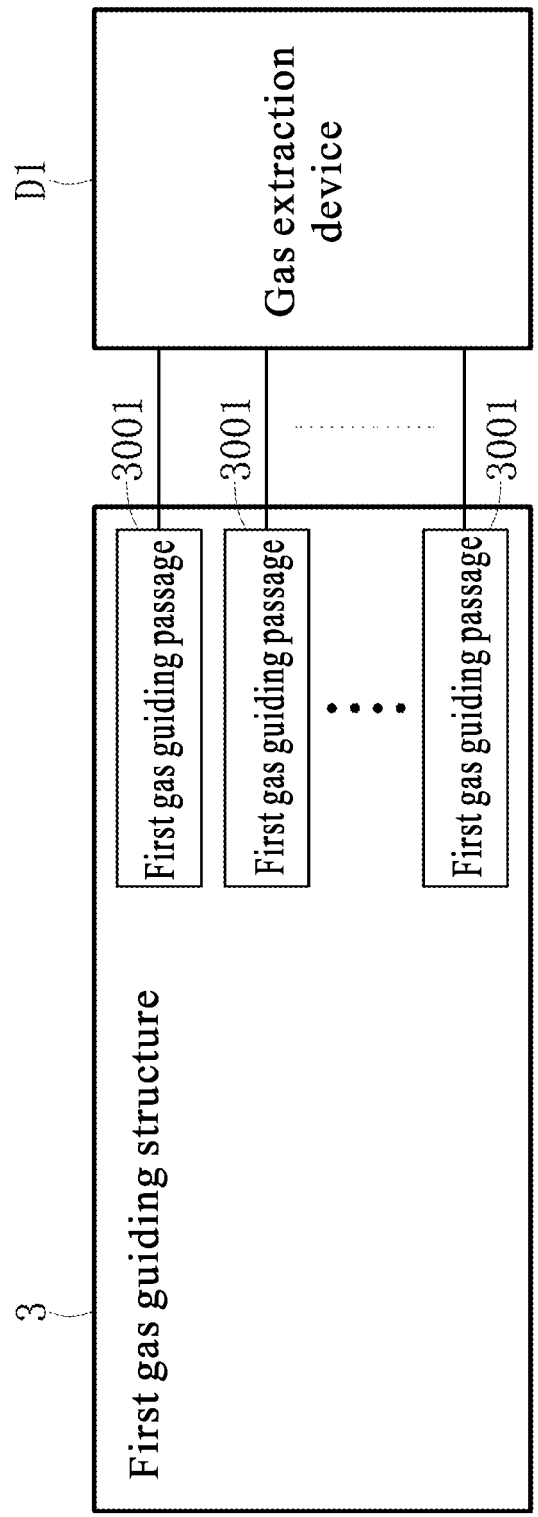
FIG. 7 is a function block diagram of a plurality of first gas guiding structures communicating with a gas extraction apparatus in a chip transferring module provided according to the first embodiment of the present invention.

Referring to FIG. 2, FIG. 5, FIG. 6 and FIG. 7, the first gas guiding structure 3 is disposed in the mounting main body 1, and has a plurality of suction openings 3000 exposed out of the mounting main body 1. For example, the first gas guiding structure 3 includes a plurality of suction nozzles 30 exposed out of the bottom side of the mounting main body 1, and the plurality of suction openings 3000 are respectively disposed on the plurality of suction nozzles 30. Moreover, the first gas guiding structure 3 has a plurality of first gas guiding passages 3001 (as shown in FIG. 5) respectively communicating with the plurality of suction openings 3000, and the plurality of first gas guiding passages 3001 communicate with a gas extraction apparatus D1 (as shown in FIG. 7). In the embodiment, the communication between the first gas guiding passages 3001 and the suction openings 3000 and the communication between the first gas guiding passages 3001 and the gas extraction apparatus D1 are gas communication. However, it can be communication for other media, which depends on the environment and the medium filled therein. This limitation can also applied to other communication present in the disclosure. Thus, when the gas extraction apparatus D1 extracts gas from the plurality of first gas guiding passages 3001, the plurality of suction nozzles 30 may be used to adsorb a transferring substrate. However, the present invention is not limited to the examples above.

Figure 4:
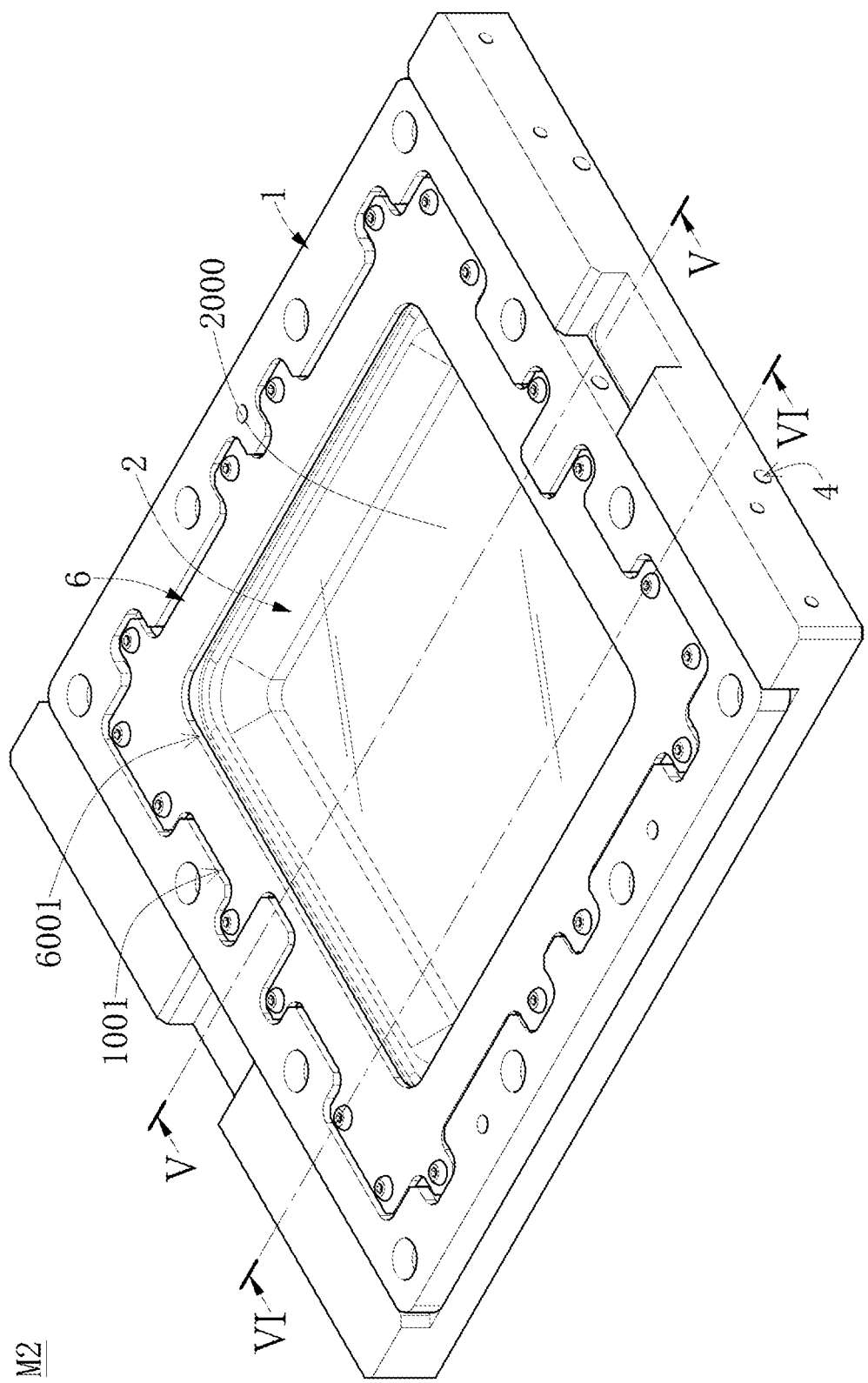
FIG. 4 is a three-dimensional schematic diagram of assembly from another perspective of a chip transferring module provided according to the first embodiment of the present invention.
Figure 8:
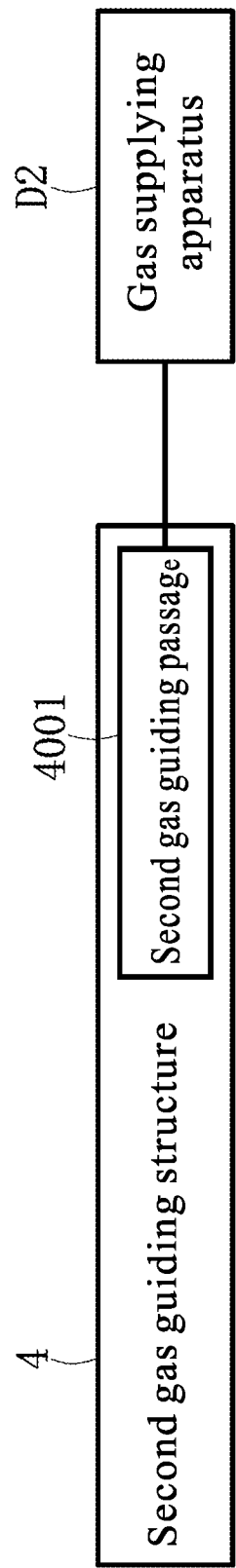
FIG. 8 is a function block diagram of a second gas guiding structure communicating with a gas supply apparatus in a chip transferring module provided according to the first embodiment of the present invention.

Referring to FIG. 4, FIG. 6 and FIG. 8, the second gas guiding structure 4 is disposed in the mounting main body 1, and has at least one intake opening 4000 communicating with the second accommodating space 1002 of the mounting main body 1. For example, the second gas guiding structure 4 has at least one second gas guiding passage 4001 communicating with the at least one intake opening 4000, and the at least one second gas guiding passage 4001 communicates with a gas supplying apparatus D2. Thus, when gas is supplied by the gas supplying apparatus D2 and inputted to the at least one second gas guiding passage 4001, the gas can pass through the at least one intake opening 4000 and be filled in the second accommodating space 1002 of the mounting main body 1. However, the present invention is not limited to the examples above.

For example, referring to FIG. 1, FIG. 3, FIG. 5 and FIG. 6, the chip transferring module M2 according to the first embodiment of the present invention further includes a gas leakproof structure 5, wherein the gas leakproof structure 5 includes a first gas leakproof ring 51 disposed in the first accommodating space 1001 of the mounting main body 1 and a second gas leakproof ring 52 disposed on the bottom side of the mounting main body 1. Further, the first gas leakproof ring 51 (for example, an O ring) is disposed between the mounting main body 1 and the light-transmitting member 2 to prevent gas in the second accommodating space 1002 of the mounting main body 1 from leaking into the first accommodating space 1001 of the mounting main body 1. Moreover, the second gas leakproof ring 52 (for example, an O ring) is partially exposed out of the bottom side of the mounting main body 1. However, the present invention is not limited to the examples above.

For example, referring to FIG. 1, FIG. 3, FIG. 5 and FIG. 6, the chip transferring module M2 according to the first embodiment of the present invention further includes at least one top side platen 6. The top side platen 6 may be secured in the first accommodating space 1001 of the mounting main body 1 by a plurality of screws T to abut against the light-transmitting member 2 and exert a predetermined pressure to the light-transmitting member 2 (at this point, the first gas leakproof ring 51 is compressed by the light-transmitting member 2). Further, the mounting main body 1 has a plurality of screw blind holes 1000 disposed in the first accommodating space 1001, the top side platen 6 has a plurality of screw holes 6000 corresponding to the plurality of screw blind holes 1000, and each screw T can pass through the corresponding screw hole 6000 so as to be connected to the corresponding screw blind hole 1000, thereby securing the top side platen 6 on the mounting main body 1. In addition, the top side platen 6 has a penetrating opening 6001 corresponding to the exposed portion 2000 of the light-transmitting member 2 to expose the exposed portion 2000 of the light-transmitting member 2 (that is to say, the exposed portion 2000 of the light-transmitting member 2 is exposed by the penetrating opening 6001 of the top side platen 6, and is not shielded by the physical part of the top side platen 6). In addition, when the present invention uses a plurality of top side platens 6 coordinating with one another, the plurality of top side platens 6 are capable of coordinating with one another so as to provide a penetrating opening 6001 corresponding to the exposed portion 2000 of the light-transmitting member 2.

Second Embodiment

Referring to FIG. 9 to FIG. 12, a device D for chip transferring and die bonding and a method for chip transferring and die bonding are provided according to a second embodiment of the present invention.

Figure 9:
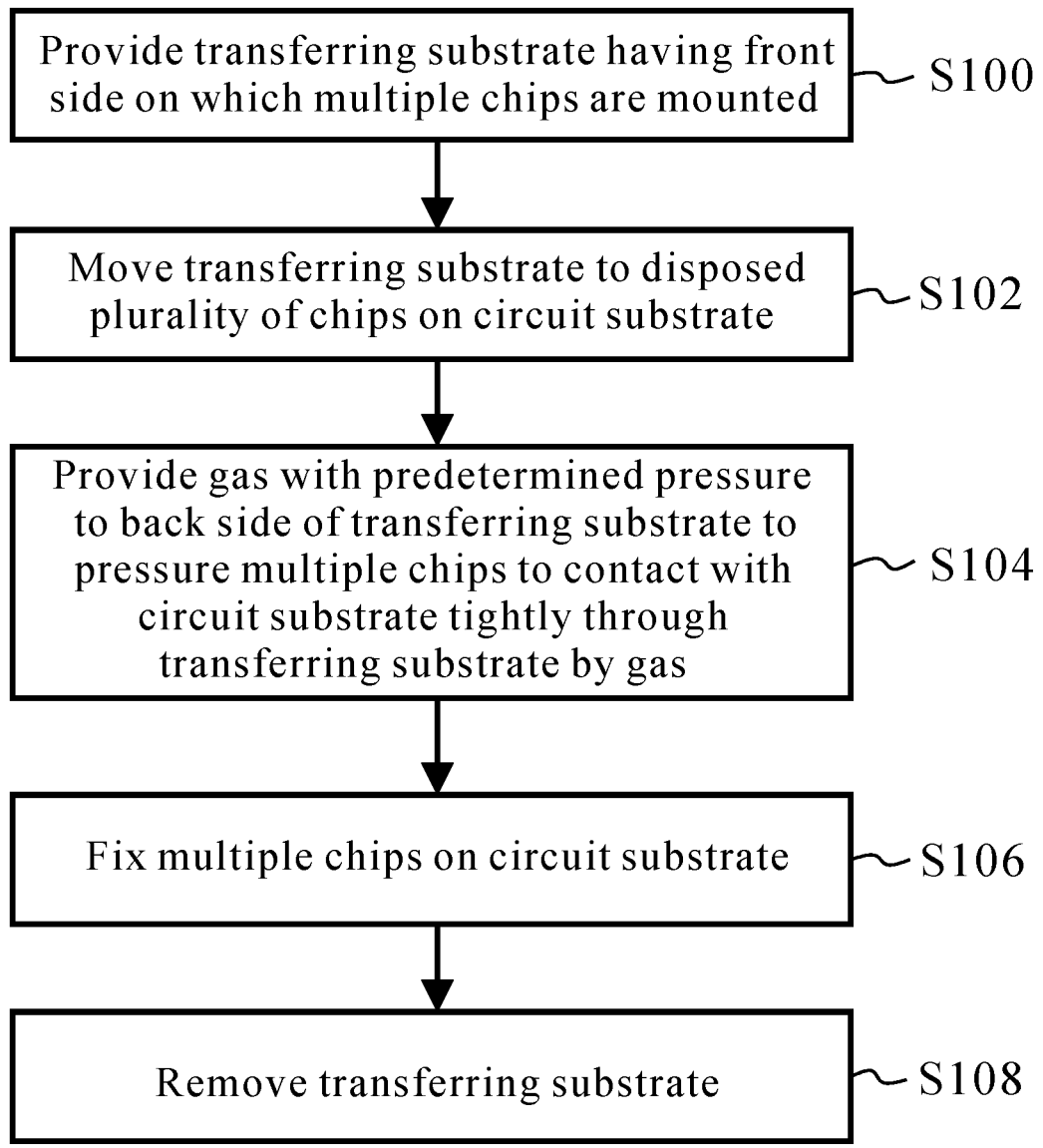
FIG. 9 is a flowchart of a method for chip transferring and die bonding provided according to a second embodiment of the present invention.

As shown in FIG. 9, a method for chip transferring and die bonding provided according to the second embodiment of the present invention includes: providing a transferring substrate S having a front side S1001 on which a plurality of chips C are mounted (step S100); absorbing and moving the transferring substrate S to dispose the plurality of chips C on a circuit substrate P (step S102); providing gas with a predetermined pressure to a back side S1002 of the transferring substrate S to pressure the plurality of chips C to contact with the circuit substrate P tightly through "the transferring substrate S is pressured by the gas" (step S104); fixing the plurality of chips C on the circuit substrate P (step S106); and removing the transferring substrate S (step S108). It should be noted that, before step S102, a plurality of conductive contacts of the plurality of chips C are respectively aligned with a plurality of conductive solder layers B (for example, tin balls or tin paste) of the circuit substrate P. In step S102, the step of "to dispose the plurality of chips C on a circuit substrate P" is "a first stage of pressing the plurality of chips C to the plurality of conductive solder layers B of the circuit substrate P". In step S104, the step of "providing gas with a predetermined pressure to a back side S1002 of the transferring substrate S" is "a second stage of pressing the plurality of chips C to the plurality of conductive solder layers B of the circuit substrate P". Thus, the plurality of chips C can tightly contact with the plurality of conductive solder layers B of the circuit substrate P (that is to say, the conductive contacts of each chip C can be seamlessly abutted on the plurality of conductive solder layers B of the circuit substrate P), thereby enhancing the electrical connection between the chips C and the circuit substrate P.

Figure 10:
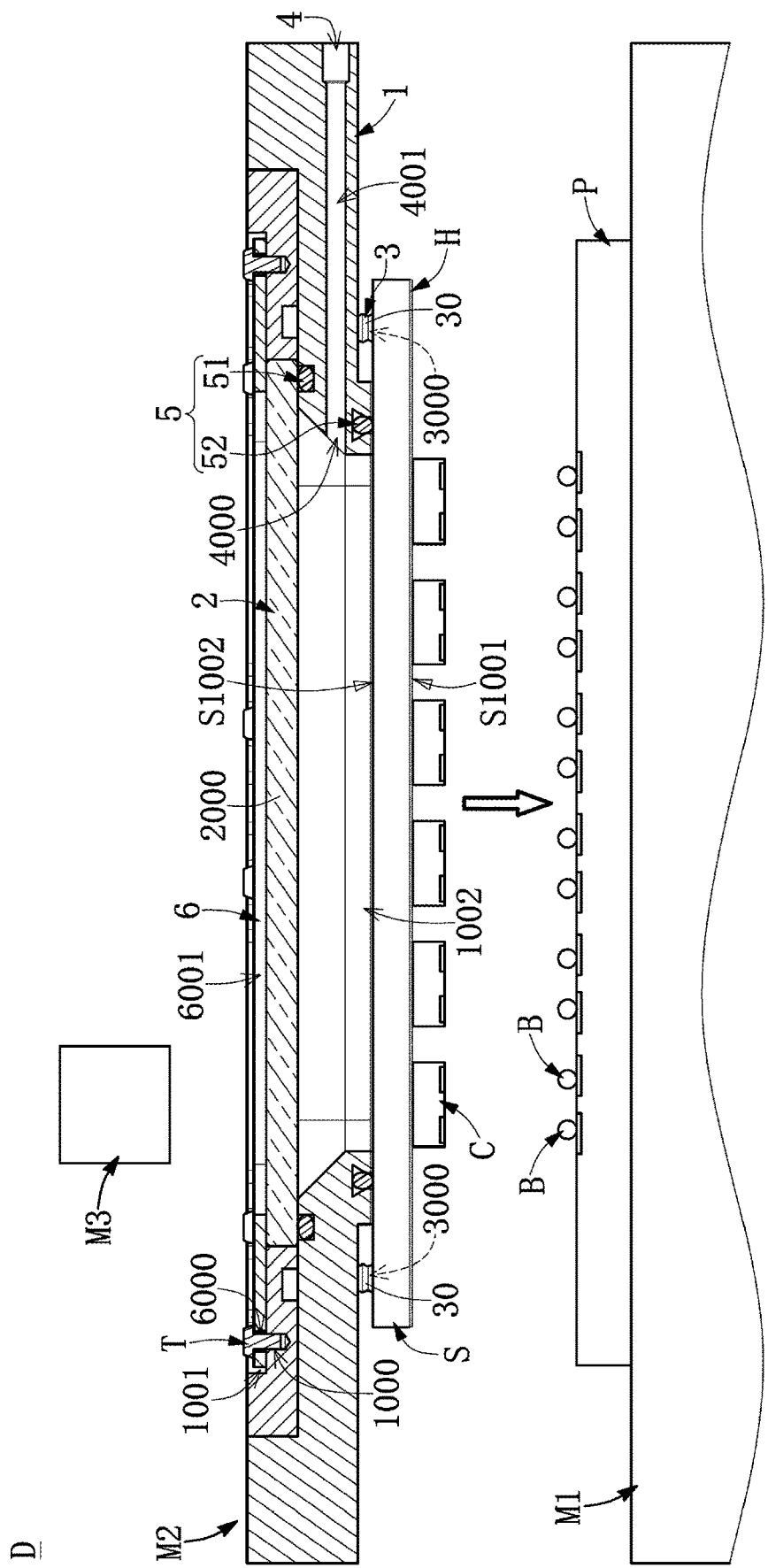
FIG. 10 is a schematic diagram of a device for chip transferring and die bonding provided according to the second embodiment of the present invention.

As shown in FIG. 10, the device D for chip transferring and die bonding provided according to the second embodiment of the present invention includes a substrate mounting module M1, a chip transferring module M2 and a laser generating module M3. The substrate mounting module M1 is for mounting a circuit substrate P, the chip transferring module M2 is for transferring a plurality of chips C onto the circuit substrate P, and the laser generating module M3 is for fixing the plurality of chips C onto the circuit substrate P. Moreover, the chip transferring module M2 includes a mounting main body 1, a light-transmitting member 2, a first gas guiding structure 3 and a second gas guiding structure 4.

For example, referring to FIG. 9 and FIG. 10, the plurality of chips C may be attached to an adhesive layer H of the transferring substrate S, and the circuit substrate P may be mounted by the substrate mounting module M1. In addition, the transferring substrate S on which the plurality of chips C are mounted may be adsorbed by the first gas guiding structure 3 of the chip transferring module M2 by suction of the first gas guiding structure 3. Further, through suction of a plurality of suction openings 3000 of the first gas guiding structure 3, the transferring substrate S on which the plurality of chips C are mounted can be adsorbed at the bottom side of the mounting main body 1 and seals the second accommodating space 1002. It should be noted that, when the transferring substrate S on which the plurality of chips C are mounted is adsorbed at the bottom side of the mounting main body 1 through suction of the plurality of suction openings 3000 of the first gas guiding structure 3 and seals the second accommodating space 1002, a second gas leakproof ring 52 is disposed between the mounting main body 1 and the transferring substrate S to prevent gas in the second accommodating space 1002 of the mounting main body 1 from leaking to outside of the mounting main body 1.

Figure 11:
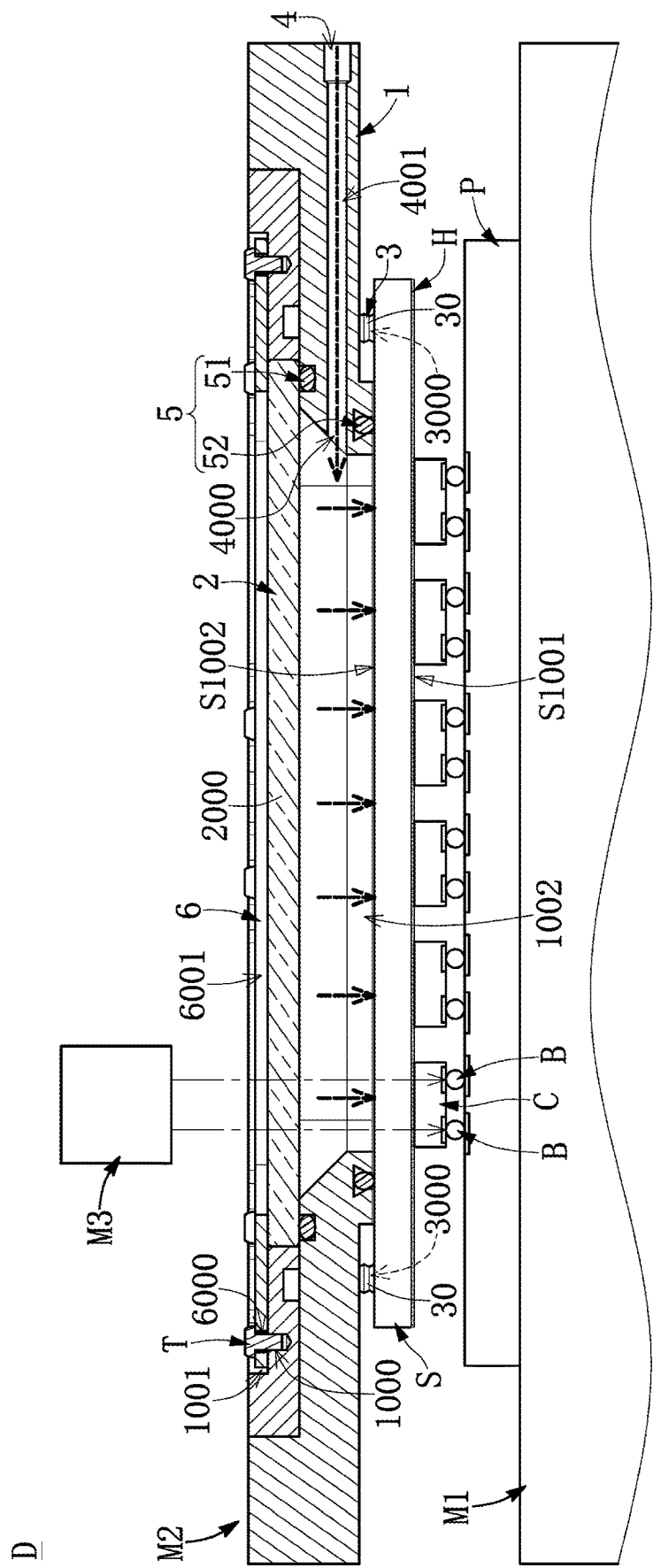
FIG. 11 is a schematic diagram of steps S102, S104 and S106 of a method for chip transferring and die bonding provided according to the second embodiment of the present invention.

For example, referring to FIG. 9 and FIG. 11, in step S104, the gas with a predetermined pressure may be introduced via the second gas guiding structure 4 of the chip transferring module M2 and be applied to a back side S1002 of the transferring substrate S. Further, when the transferring substrate S on which the plurality of chips C are mounted is adsorbed at the bottom side of the mounting main body 1 through "suction of the plurality of suction openings 3000 of the first gas guiding structure 3" and seals the second accommodating space 1002, gas with a predetermined pressure may be introduced into a second accommodating space 1002 of the mounting main body 1 via "at least one intake opening 4000 of the second gas guiding structure 4), so that the gas with the predetermined pressure may uniformly pressure the back side S1002 of the transferring substrate S, allowing the plurality of chips C to contact with the circuit substrate P tightly through "the transferring substrate S uniformly pressured by the gas" (that is to say, the conductive contacts of each chip C can be seamlessly abutted on a plurality of conductive solder layers B of the circuit substrate P), thereby enhancing the electrical connection between the chips C and the circuit substrate P (improving the product yield rate).

For example, referring to FIG. 9 and FIG. 11, in step S106, the plurality of chips C may be fixed on the circuit substrate P through illumination of the laser generating module M3. Further, when a laser beam generated by the laser generating module M3 can sequentially pass through the light-transmitting member 2, the transferring substrate S (light-transmitting substrate) and the chips C and be projected on the plurality of conductive solder layers B between the chips C and the circuit substrate P, the plurality of conductive solder layers B can be cured by the illumination of the laser beam generated by the laser generating module M3, thereby fixing the plurality of chips C on the circuit substrate P.

Figure 12:
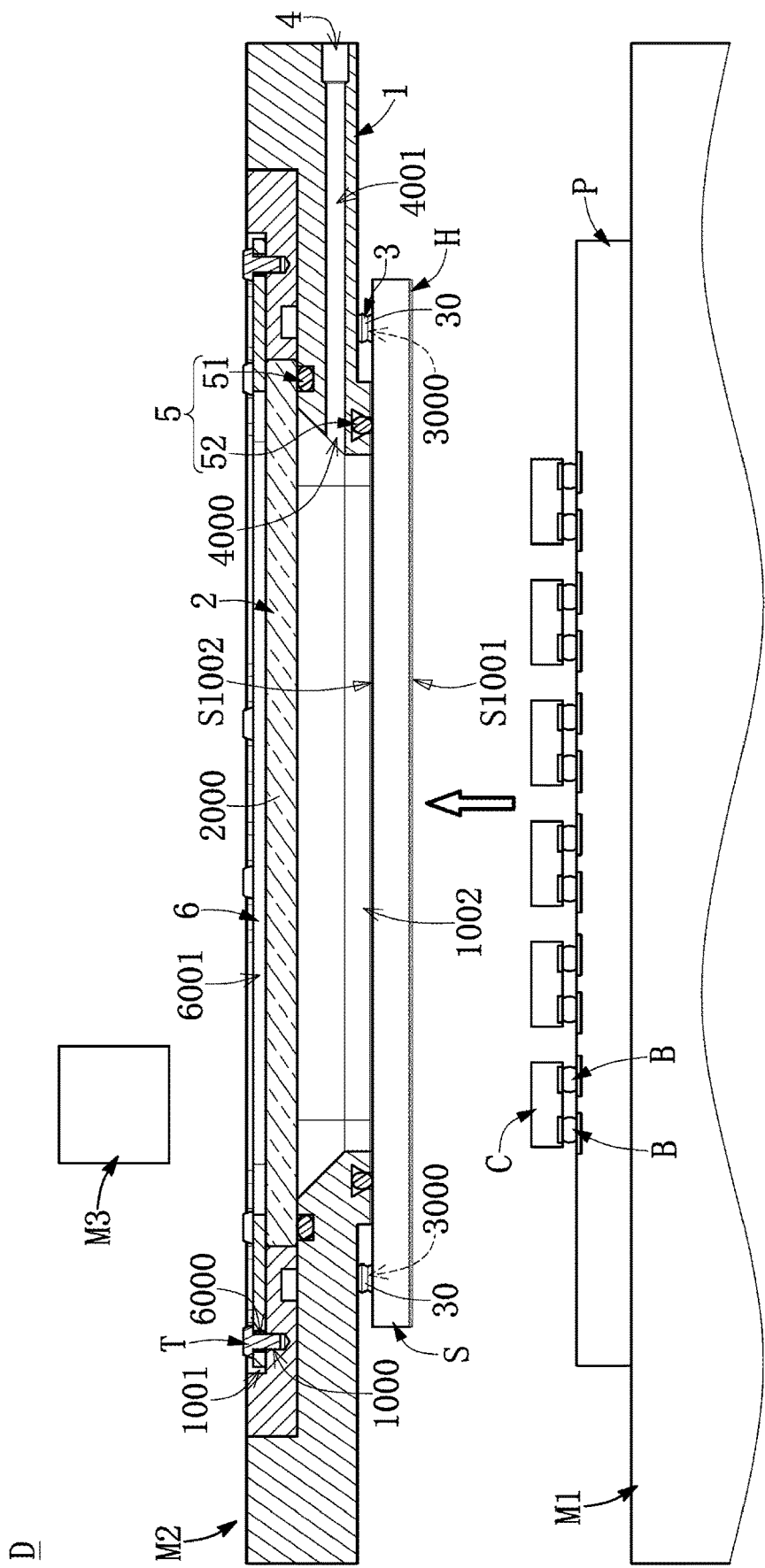
FIG. 12 is a schematic diagram of step S108 of a method for chip transferring and die bonding provided according to the second embodiment of the present invention.

For example, referring to FIG. 9 and FIG. 12, in step S108, the transferring substrate S can be detached from the plurality of chips C fixed on the circuit substrate P through mounting of the chip transferring module M2. Further, when the plurality of chips C are fixed on the circuit substrate P through illumination of the laser beam generated by the laser generating module M3, because the "bonding force" provided by the plurality of conductive solder layers B to the chips C (or the "bonding force" between the plurality of conductive solder layers B and chips C) is greater than the "adhesion" provided by the adhesive layer H of the transferring substrate S to the chips C (or the "adhesion" between the adhesive layer H of the transferring substrate S and the chips C), the transferring substrate S can be detached from the plurality of chips C fixed on the circuit substrate P through mounting of the transferring module M2.

Benefits of the Embodiments

One benefit achieved by the present invention is that, in the chip transferring and die bonding device D and the chip transferring module M2 thereof of the present invention, by the technical solutions "the mounting main body 1 includes a first accommodating space 1001 and a second accommodating space 1002", "the light-transmitting member 2 is disposed in the first accommodating space 1001 of the mounting main body 1", "the first gas guiding structure 3 is disposed in the mounting main body 1, and has a plurality of suction openings 3000 exposed out of the mounting main body 1" and "the second gas guiding structure 4 is disposed in the mounting main body 1, and has at least one intake opening 4000 communicating with the second accommodating space 1002 of the mounting main body 1", when a transferring substrate S mounted with a plurality of chips C is adsorbed at the bottom side of the mounting main body 1 through suction of the plurality of suction openings 3000 of the first gas guiding structure 3 and seals the second accommodating space 1002, gas with a predetermined pressure is introduced via at least one intake opening 4000 of the second gas guiding structure 4 and enters the second accommodating space 1002 of the mounting main body 1, such that the gas with the predetermined pressure uniformly pressures a back side S1002 of the transferring substrate S. Thus, the plurality of chips C can tightly contact with the circuit substrate P by "the transferring plate S uniformly pressured by the gas", thereby enhancing the electrical connection between the chips C and the circuit substrate P.

Another benefit achieved by the present invention is that, in the method for chip transferring and die bonding of the present invention, by the technical solutions "providing a transferring substrate S having a front side S1001 on which a plurality of chips C are mounted", "moving the transferring substrate S to dispose the plurality of chips C on a circuit substrate P", "providing gas with a predetermined pressure to a back side S1002 of the transferring substrate S to pressure the plurality of chips C to contact with the circuit substrate P tightly through the transferring substrate S by the gas", "fixing the plurality of chips C on the circuit substrate P", and "removing the transferring substrate S", when a transferring substrate S mounted with a plurality of chips C is adsorbed at the bottom side of the mounting main body 1 through suction of the plurality of suction openings 3000 of the first gas guiding structure 3 and seals the second accommodating space 1002, gas with a predetermined pressure is introduced via at least one intake opening 4000 of the second gas guiding structure 4 and enters the second accommodating space 1002 of the mounting main body 1, such that the gas with the predetermined pressure uniformly pressures a back side S1002 of the transferring substrate S. Thus, the plurality of chips C can tightly contact with the circuit substrate P by "the transferring plate S uniformly pressured by the gas", thereby enhancing the electrical connection between the chips C and the circuit substrate P.

The disclosure above are merely preferred feasible embodiments of the present invention and is not to be construed as limitations to the scope of claims of the present invention. It should be noted that all equivalent technical variations made to the description and the drawings of the present invention are to be encompassed within the scope of claims of the present invention.

What is claimed is:

1. A chip transferring module for mounting a transferring substrate with a plurality of chips, comprising:
   a mounting main body with a first accommodating space and a second accommodating space;
   a light-transmitting member disposed in the first accommodating space;
   a first gas guiding structure disposed in the mounting main body and having a plurality of suction openings exposed out of the mounting main body; and
   a second gas guiding structure disposed in the mounting main body and having at least one intake opening communicating with the second accommodating space.

2. The chip transferring module according to claim 1, wherein the first accommodating space and the second accommodating space are respectively formed on a top side and a bottom side of the mounting main body, and the first accommodating space and the second accommodating space are separated by the light-transmitting member from communicating with each other;

wherein the first gas guiding structure has a plurality of first gas guiding passages respectively communicating with the plurality of suction openings, and the plurality of first gas guiding passages communicate with a gas extraction apparatus;

wherein the second gas guiding structure has at least one second gas guiding passage communicating with the at least one intake opening, and the at least one second gas guiding passage communicates with a gas supplying apparatus.

3. The chip transferring module according to claim 1, further comprising a gas leakproof structure, wherein the gas leakproof structure comprises a first gas leakproof ring disposed in the first accommodating space and a second gas leakproof ring disposed on a bottom side of the mounting main body;

wherein the first gas leakproof structure is disposed between the mounting main body and the light-transmitting member for preventing gas in the second accommodating space from leaking into the first accommodating space;

wherein the second gas leakproof ring is partially exposed out of the bottom side of the mounting main body.

4. The chip transferring module according to claim 1, further comprising at least one top side platen and a plurality of screws, wherein the top side platen is secured in the first accommodating space through the plurality of screws for abutting against and exerting a predetermined pressure to the light-transmitting member;

wherein the light-transmitting member has an exposed portion corresponding to the second accommodating space, and the top side platen provides a penetrating opening corresponding to the exposed portion.

5. The chip transferring module according to claim 1, wherein the first gas guiding structure comprises a plurality of suction nozzles exposed out of a bottom portion of the mounting main body, and the plurality of suction openings are respectively disposed on the plurality of suction nozzles.

6. A method of chip transferring and die bonding, comprising:

providing a transferring substrate having a front side on which a plurality of chips are mounted;

moving the transferring substrate to dispose the plurality of chips on a circuit substrate;

providing gas with a predetermined pressure to a back side of the transferring substrate for pressuring the plurality of chips to contact with the circuit substrate tightly through the transferring substrate by the gas;

fixing the plurality of chips on the circuit substrate; and removing the transferring substrate.

7. The method according to claim 6, wherein the transferring substrate is adsorbed through suction of a first gas guiding structure of a chip transferring module, and the gas is provided to the back side of the transferring substrate through guiding of a second gas guiding structure of the chip transferring module.

8. The method according to claim 7, wherein the plurality of chips are fixed on the circuit substrate through illumination of a light source generated by a laser generating module, and the transferring substrate is detached from the plurality of chips fixed on the circuit substrate through mounting of the chip transferring module.

9. A device for chip transferring and die bonding, comprising:

a substrate mounting module for mounting a circuit substrate;

a chip transferring module for transferring a plurality of chips onto the circuit substrate; and a laser generating module for fixing the plurality of chips on the circuit substrate;

wherein the chip transferring module comprises:

a mounting main body with a first accommodating space and a second accommodating space;

a light-transmitting member disposed in the first accommodating space;

a first gas guiding structure disposed in the mounting main body and having a plurality of suction openings exposed out of the mounting main body; and a second gas guiding structure disposed in the mounting main body and having at least one intake opening communicating with the second accommodating space.

10. The device according to claim 9, further comprising a gas extraction apparatus and a gas supplying apparatus, wherein the first gas guiding structure has a plurality of first gas guiding passages respectively communicating with the plurality of suction openings, and the plurality of first gas guiding passages communicate with the gas extraction apparatus;

wherein the second gas guiding structure has at least one second gas guiding passage communicating with the at least one intake opening, and the at least one second gas guiding passage communicates with the gas supplying apparatus.

\* \* \* \* \*